United States Patent
Li

(10) Patent No.: US 11,380,870 B2
(45) Date of Patent: Jul. 5, 2022

(54) OLED ENCAPSULATION STRUCTURE INCLUDING SELF-HEALING ENCAPSULATION LAYER, METHOD OF ENCAPSULATING THEREOF, AND OLED DISPLAY DEVICE INCLUDING SAME

(71) Applicant: Wuhan China Star Optoelectronics Semiconductor Display Technology Co., Ltd., Hubei (CN)

(72) Inventor: Zhao Li, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 253 days.

(21) Appl. No.: 16/770,514

(22) PCT Filed: Apr. 9, 2020

(86) PCT No.: PCT/CN2020/084043
§ 371 (c)(1),
(2) Date: Jun. 5, 2020

(87) PCT Pub. No.: WO2021/189539
PCT Pub. Date: Sep. 30, 2021

(65) Prior Publication Data
US 2022/0037618 A1    Feb. 3, 2022

(30) Foreign Application Priority Data

Mar. 26, 2020 (CN) .......................... 202010224021.7

(51) Int. Cl.
*H01L 29/08* (2006.01)
*H01L 51/52* (2006.01)
*H01L 51/56* (2006.01)

(52) U.S. Cl.
CPC .......... *H01L 51/5253* (2013.01); *H01L 51/56* (2013.01)

(58) Field of Classification Search
CPC ........................... H01L 51/5253; H01L 51/56
See application file for complete search history.

(56) References Cited

U.S. PATENT DOCUMENTS

2010/0140644 A1   6/2010  Kai et al.
2014/0057379 A1*  2/2014  Park .................. G03F 7/094
                                                        438/46

(Continued)

FOREIGN PATENT DOCUMENTS

CN        107369781 A      11/2017
CN        107683314 A       2/2018
(Continued)

*Primary Examiner* — Caleb E Henry
(74) *Attorney, Agent, or Firm* — Kirton McConkie; Evan R. Witt

(57) ABSTRACT

The present application relates to an organic light-emitting diode (OLED) encapsulation structure, a method of encapsulating an organic light-emitting diode (OLED), and an organic light-emitting diode (OLED) display device. The OLED encapsulation structure includes a substrate, a self-healing encapsulation layer, and at least two inorganic encapsulation layers, wherein a cavity is formed between two adjacent layers of the inorganic encapsulation layers, a layer of the self-healing encapsulation layer is provided in the cavity, and one of the inorganic encapsulation layers covers the OLED device. The self-healing encapsulation layer 13 is used to achieve self-healing of cracks at room temperature to prevent water and oxygen from entering the interior of the OLED panel through cracks.

11 Claims, 3 Drawing Sheets

(56) References Cited

U.S. PATENT DOCUMENTS

| | | | | |
|---|---|---|---|---|
| 2014/0145588 | A1* | 5/2014 | Oh | H01L 51/5253 |
| | | | | 445/25 |
| 2015/0079726 | A1* | 3/2015 | Cho | H01L 51/56 |
| | | | | 438/99 |
| 2015/0123103 | A1* | 5/2015 | Konda | H01L 51/5246 |
| | | | | 257/40 |
| 2015/0361195 | A1* | 12/2015 | Faust | C07D 311/08 |
| | | | | 525/384 |
| 2017/0092897 | A1* | 3/2017 | Liu | H01L 51/004 |
| 2018/0342693 | A1* | 11/2018 | Sato | H01L 51/0097 |
| 2019/0062608 | A1 | 2/2019 | Aloshyna ep Lesuffleur et al. | |
| 2020/0294883 | A1* | 9/2020 | Dede | H01L 27/0251 |

FOREIGN PATENT DOCUMENTS

| | | |
|---|---|---|
| CN | 108933161 A | 12/2018 |
| CN | 109503035 A | 3/2019 |
| CN | 110048016 A | 7/2019 |
| CN | 110452399 A | 11/2019 |

* cited by examiner

OLED ENCAPSULATION STRUCTURE INCLUDING SELF-HEALING ENCAPSULATION LAYER, METHOD OF ENCAPSULATING THEREOF, AND OLED DISPLAY DEVICE INCLUDING SAME

BACKGROUND OF INVENTION

Field of Invention

The present application relates to a technical field of display panel encapsulation, and in particular, to an organic light-emitting diode (OLED) encapsulation structure, a method of encapsulating an organic light-emitting diode (OLED), and an organic light-emitting diode (OLED) display device.

Description of Prior Art

In recent years, with the rapid development of organic light-emitting diode (OLED) display technology, OLED products have received more and more attention due to their advantages such as lightness, fast response times, wide viewing angles, high contrast, and flexibility, and are mainly used in display fields such as mobile phones, tablets, and televisions.

The main component of an organic light-emitting diode (OLED) display device is an OLED display panel, which includes a glass substrate, a polyimide, polyimide (PI) flexible layer, a thin film transistor (TFT) driving layer, an OLED light-emitting layer, a first inorganic encapsulation layer, an organic encapsulation layer, and a second inorganic encapsulation layer, wherein the organic encapsulation layer mainly plays a role of planarization and blocking water and oxygen transmission.

In the implementation process, the inventors found that the conventional technology has at least the problem that cracks are prone to occur in the organic encapsulation layer in the conventional OLED display panel, so that water and oxygen can enter the interior of the OLED display panel through the cracks to accelerate the aging of the OLED device.

SUMMARY OF INVENTION

In view of above, there is a need to provide an organic light-emitting diode (OLED) encapsulation structure, a method of encapsulating an organic light-emitting diode (OLED), and an organic light-emitting diode (OLED) display device, to solve the problem that cracks are prone to occur in the organic encapsulation layer in the conventional OLED display panel, so that water and oxygen can enter the interior of the OLED display panel through the cracks to accelerate the aging of the OLED device.

In order to achieve the above object, in one aspect, an embodiment of the present application provides an organic light-emitting diode (OLED) encapsulation structure including a substrate, a self-healing encapsulation layer, and at least two inorganic encapsulation layers, wherein a number of layers of the self-healing encapsulation layer is one less than a number of layers of the inorganic encapsulation layers, and the self-healing encapsulation layer is made of a material including methyl methacrylate and n-butyl acrylate that are mixed in a preset molar ratio; and wherein an OLED device is fabricated on the substrate, a cavity is formed between two adjacent layers of the inorganic encapsulation layers, a layer of the self-healing encapsulation layer is provided in the cavity, and one of the inorganic encapsulation layers covers the OLED device.

In another aspect, an embodiment of the present application further provides a method of encapsulating an organic light-emitting diode (OLED), including the following steps:

(1) providing a substrate on which an OLED device is fabricated;

(2) forming an inorganic encapsulation layer on the substrate to cover the OLED device;

(3) forming a self-healing encapsulation layer on the inorganic encapsulating layer in the step (2), wherein the self-healing encapsulation layer is made of a material including methyl methacrylate and n-butyl acrylate that are mixed in a preset molar ratio;

(4) forming an inorganic encapsulation layer on the self-healing encapsulation layer in the step (3), wherein a cavity is formed between the inorganic encapsulation layer in the step (2) and the inorganic encapsulation layer in the step (4), and the self-healing encapsulation layer in the step (4) is wrapped in the cavity; and (5) performing the steps (3) and (4) cyclically until formations of all the inorganic encapsulation layers and the self-healing encapsulation layer have been completed.

In further another aspect, an embodiment of the present application further provides an organic light-emitting diode (OLED) display device including an OLED display panel which includes an OLED encapsulation structure, wherein the OLED encapsulation structure includes a substrate, a self-healing encapsulation layer, and at least two inorganic encapsulation layers, wherein a number of layers of the self-healing encapsulation layer is one less than a number of layers of the inorganic encapsulation layers, and the self-healing encapsulation layer is made of a material including methyl methacrylate and n-butyl acrylate that are mixed in a preset molar ratio; and wherein an OLED device is fabricated on the substrate, a cavity is formed between two adjacent layers of the inorganic encapsulation layers, a layer of the self-healing encapsulation layer is provided in the cavity, and one of the inorganic encapsulation layers covers the OLED device.

The OLED encapsulation structure provided by the embodiments of the present application includes: a substrate, a self-healing encapsulation layer, and at least two inorganic encapsulation layers, wherein an OLED device is fabricated on the substrate, a cavity is formed between two adjacent layers of the inorganic encapsulation layers, a layer of the self-healing encapsulation layer is provided in the cavity, and one of the inorganic encapsulation layers covers the OLED device; and wherein a number of layers of the self-healing encapsulation layer is one less than a number of layers of the inorganic encapsulation layers, and the self-healing encapsulation layer is made of a material including methyl methacrylate and n-butyl acrylate that are mixed in a preset molar ratio. The self-healing encapsulation layer is used to achieve self-healing of cracks at room temperature to prevent water and oxygen from entering the interior of the OLED panel through cracks to accelerate the aging of the OLED device, and as a result, the oxidation resistance of the OLED display panel is improved.

Figure 1:
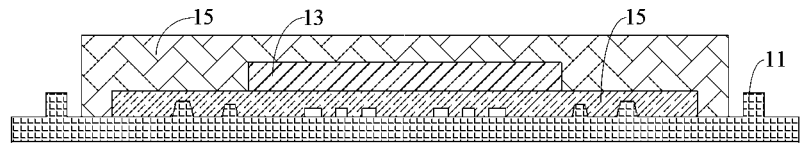
FIG. 1 is a schematic structural diagram of an organic light-emitting diode (OLED) encapsulation structure according to an embodiment of the present application.

Elements in the drawings are designated by numerals as listed below. 11. substrate; 13. self-healing encapsulation layer; 15. inorganic encapsulation layer.

DETAILED DESCRIPTION OF PREFERRED EMBODIMENTS

In order to facilitate understanding of the present application, the present application will be described more fully with reference to the related drawings. Preferred embodiments of the present application are shown in the drawings. However, the present application can be implemented in many different forms and is not limited to the embodiments described herein. Rather, these embodiments are provided so that this disclosure will be thorough and complete.

It should be noted that when an element is considered to be "connected" to another element, it may be directly connected to the other element and combined with it, or there may be an intervening element at the same time. The terms "install", "one end", "the other end" and similar expressions used herein are for illustrative purposes only.

Unless defined otherwise, all technical and scientific terms used herein have the same meaning as commonly understood by one of ordinary skill in the art to which this application belongs. The terminology used herein in the specification of the present application is only for the purpose of describing specific embodiments, and is not intended to limit the present application. The term "and/or" as used herein includes any and all combinations of one or more of the associated listed items.

In order to solve the problem of the conventional OLED display panel that cracks are prone to occur in the organic encapsulation layer in the conventional OLED display panel, so that water and oxygen can enter the interior of the OLED display panel through the cracks to accelerate the aging of the OLED device, one embodiment, as shown in FIG. 1, provides an organic light-emitting diode (OLED) encapsulation structure includes a substrate 11, a self-healing encapsulation layer 13, and at least two inorganic encapsulation layers 15.

A number of layers of the self-healing encapsulation layer 13 is one less than a number of layers of the inorganic encapsulation layers, 15 and the self-healing encapsulation layer 13 is made of a material including methyl methacrylate and n-butyl acrylate that are mixed in a preset molar ratio.

An OLED device is fabricated on the substrate 11, a cavity is formed between two adjacent layers of the inorganic encapsulation layers 15, a layer of the self-healing encapsulation layer 13 is provided in the cavity, and one of the inorganic encapsulation layers 15 covers the OLED device.

It should be noted that the substrate 11 is a carrier substrate for the OLED device and the organic light-emitting diode (OLED) encapsulation structure, and it is transparent. The substrate 11 may made of, but is not limited to, the following materials: polyimide, polyethylene terephthalate, polyethylene naphthalate, polycarbonate, polyethersulfone, and/or glass.

OLED devices are fabricated on the substrate 11. The OLED devices include an anode, a hole transport layer, an OLED light-emitting layer, an electron transport layer, and a metal cathode, which are sequentially disposed in a direction away from the substrate 11.

In order to encapsulate the OLED device, a combination of a self-healing encapsulation layer 13 and at least two inorganic encapsulation layers 15 is used. The self-healing encapsulation layer 13 is capable of healing cracks at room temperature by itself, and made of a material including methyl methacrylate and n-butyl acrylate that are mixed in a preset molar ratio. Specifically, the preset molar ratio ranges from 45/55 to 55/45. In one example, the molar ratio of methyl acrylate and n-butyl acrylate is 50/50. In another example, the molar ratio of methyl acrylate and n-butyl acrylate is 40/50. Further, the material of the self-healing encapsulation layer 13 further includes a curing agent.

The inorganic encapsulation layers 15 are used to provide physical protection for the OLED device. The inorganic encapsulation layers 15 may be made of, but is not limited to, silicon nitride (SiNx). A number of layers of the inorganic encapsulation layers 15 is one more than a number of layers of the self-healing encapsulation layer 13. After the encapsulation is completed, one self-healing encapsulation layer 13 is sandwiched between every two inorganic encapsulation layers 15.

In a specific embodiment, an organic light-emitting diode (OLED) encapsulation structure includes a substrate 11, a self-healing encapsulation layer 13, and two inorganic encapsulation layers 15. The self-healing encapsulation layer 13 is made of a material including methyl methacrylate and n-butyl acrylate that are mixed in a preset molar ratio.

An OLED device is fabricated on the substrate 11, one self-healing encapsulation layer 13 is sandwiched between two inorganic encapsulation layers 15, and one of the inorganic encapsulation layers 15 covers the OLED device.

In the OLED encapsulation structure according to each of embodiments of the present application, the OLED encapsulation structure includes a substrate 11, a self-healing encapsulation layer 13, and at least two inorganic encapsulation layers 15; an OLED device is fabricated on the substrate 11; one of the self-healing encapsulation layer 13 is sandwiched between adjacent layers of the inorganic encapsulation layers 15, and one of the inorganic encapsulation layers 15 covers the OLED device. A number of layers of the self-healing encapsulation layer 13 is one less than a number of layers of the inorganic encapsulation layers 15, and the self-healing encapsulation layer is made of a material including methyl methacrylate and n-butyl acrylate that are mixed in a preset molar ratio. The self-healing encapsulation layer 13 is used to achieve self-healing of cracks at room temperature to prevent water and oxygen from entering the interior of the OLED panel through cracks to accelerate the aging of the OLED device, and as a result, the oxidation resistance of the OLED display panel is improved.

Figure 2:
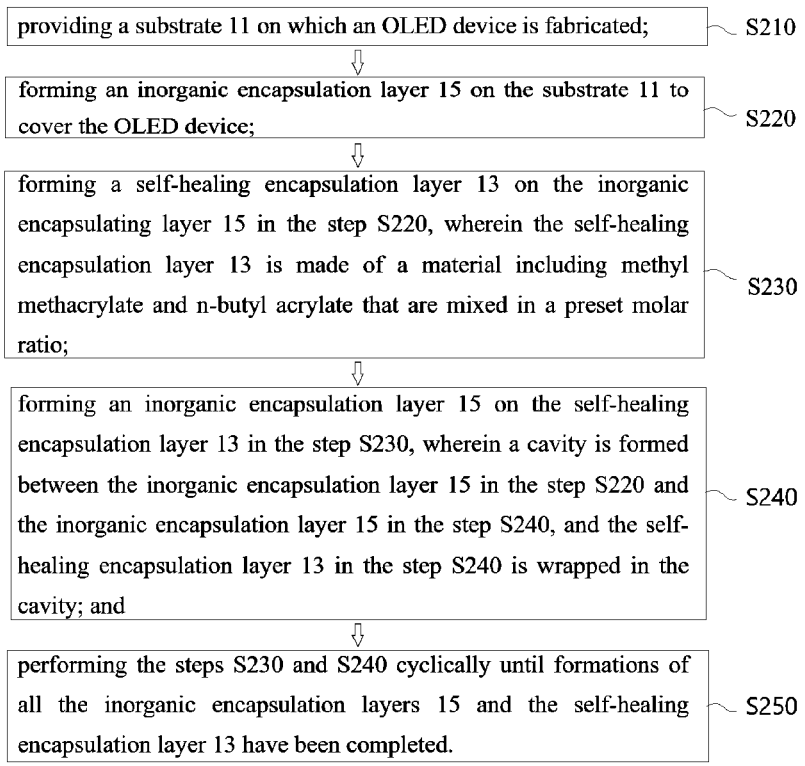
FIG. 2 is a schematic flowchart of a method of encapsulating an organic light-emitting diode (OLED) according to an embodiment of the present application.

In one embodiment, as shown in FIG. 2, a method of encapsulating an organic light-emitting diode (OLED) is further provided, including the following steps:

Step S210 providing a substrate 11 on which an OLED device is fabricated;

Step S220 forming an inorganic encapsulation layer 15 on the substrate 11 to cover the OLED device;

Step S230 forming a self-healing encapsulation layer 13 on the inorganic encapsulating layer 15 in the step S220, wherein the self-healing encapsulation layer 13 is made of a material including methyl methacrylate and n-butyl acrylate that are mixed in a preset molar ratio;

Step 240 forming an inorganic encapsulation layer 15 on the self-healing encapsulation layer 13 in the step S230, wherein a cavity is formed between the inorganic encapsulation layer 15 in the step S220 and the inorganic encapsulation layer 15 in the step S240, and the self-healing encapsulation layer 13 in the step S240 is wrapped in the cavity; and Step 250 performing the steps S230 and S240 cyclically until formations of all the inorganic encapsulation layers 15 and the self-healing encapsulation layer 13 have been completed.

Figure 3:
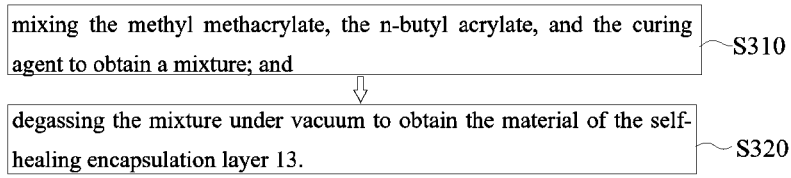
FIG. 3 is a schematic flowchart of forming a material of a self-healing encapsulation layer according to an embodiment of the present application.

It should be noted that, before the encapsulation, a material for forming the self-healing encapsulation layer 13 must be prepared. In one example, the material of the self-healing encapsulation layer 13 includes methyl methacrylate, n-butyl acrylate, and a curing agent. As shown in FIG. 3, the material of the self-healing encapsulation layer 13 is prepared based on the following specific steps:

Step S310: mixing the methyl methacrylate, the n-butyl acrylate, and the curing agent to obtain a mixture; and Step S320, degassing the mixture under vacuum to obtain the material of the self-healing encapsulation layer 13.

Specifically, the preset molar ratio of methyl methacrylate and n-butyl acrylate ranges from 45/55 to 55/45.

In one example, in the steps S220 and S240, the inorganic encapsulation layer 15 can be made by, but not limited to, chemical vapor deposition.

Figure 4:
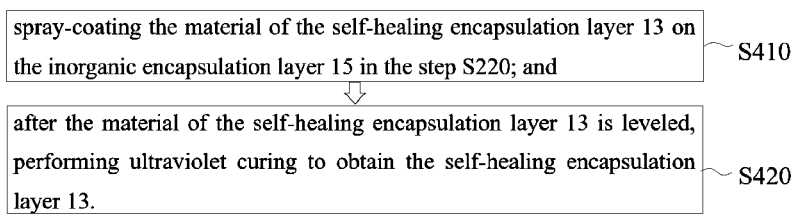
FIG. 4 is a schematic flowchart of a step of forming a self-healing encapsulation layer according to an embodiment of the present application.

In an example, as shown in FIG. 4, in the step S230, the step of forming a self-healing encapsulation layer on the inorganic encapsulation layer in the step S220 includes the steps as follows:

Step S410 spray-coating the material of the self-healing encapsulation layer 13 on the inorganic encapsulation layer 15 in the step S220; and Step S420 after the material of the self-healing encapsulation layer 13 is leveled, performing ultraviolet curing to obtain the self-healing encapsulation layer 13.

Figure 5:
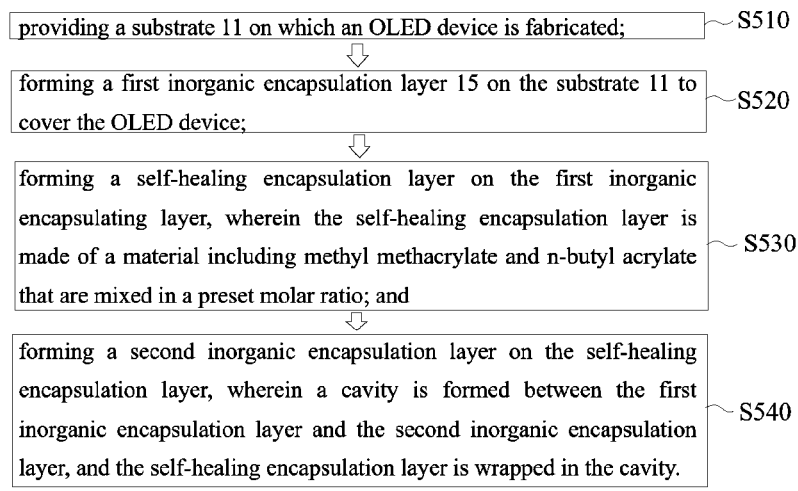
FIG. 5 is a schematic flowchart of a method of encapsulating an organic light-emitting diode (OLED) according to another embodiment of the present application.

In a specific embodiment, the method of encapsulating the OLED, as shown in FIG. 5, includes the following steps:

Step S510, providing a substrate 11 on which an OLED device is fabricated;

Step S520, forming a first inorganic encapsulation layer 15 on the substrate 11 to cover the OLED device;

Step S530, forming a self-healing encapsulation layer on the first inorganic encapsulating layer, wherein the self-healing encapsulation layer is made of a material including methyl methacrylate and n-butyl acrylate that are mixed in a preset molar ratio; and Step S540, forming a second inorganic encapsulation layer on the self-healing encapsulation layer, wherein a cavity is formed between the first inorganic encapsulation layer and the second inorganic encapsulation layer, and the self-healing encapsulation layer is wrapped in the cavity.

In the method of encapsulating the OLED according to each of embodiments of the present application, By making a self-healing encapsulation layer that can heal cracks by itself, water and oxygen can be prevented from entering the interior of the OLED panel through cracks to accelerate the aging of the OLED device and as a result, the oxidation resistance of the OLED display panel is improved.

It should be understood that although the steps in the flowchart of FIG. 2-5 are sequentially displayed according to the directions of the arrows, these steps are not necessarily performed sequentially in the order indicated by the arrows. Unless explicitly stated in this document, the execution of these steps is not strictly limited, and these steps can be performed in other orders. Moreover, at least a part of the steps in FIG. 2-5 may include multiple sub-steps or stages, and these sub-steps or stages are not necessarily performed at the same time, but may be performed at different times. In addition, the execution order of these sub-steps or stages is not necessarily performed sequentially, but may be performed in turn or alternately with other steps or at least a part of sub-steps or stages of other steps.

In one embodiment, an organic light-emitting diode (OLED) display device is further provided, which includes an OLED display panel that contains the above-mentioned OLED encapsulation structure.

It should be noted that the OLED encapsulation structure in this embodiment is the same as the OLED encapsulation structure described in each of embodiments for illustrating the OLED encapsulation structure of the present application. For specific descriptions, please refer to the content of each of the embodiments for illustrating the OLED encapsulation structure of the present application, which will not be repeated herein for brevity.

In the OLED display device according to each of the embodiments of the present application, the OLED display device is provided with a self-healing encapsulation layer 13 that heals the cracks on its own, slowing down the degradation of the OLED device and extending the service life of the OLED display device.

The technical features of the embodiments described above can be arbitrarily combined. In order to simplify the description, all possible combinations of the technical features in the above embodiments have not been described. However, as long as there is no contradiction in the combinations of these technical features, It should be considered as the scope described in this specification.

The above-mentioned embodiments only express several implementation manners of the present application, and their descriptions are more specific and detailed, but they cannot be understood as a limitation on the scope of patent application. It should be noted that, for those of ordinary skill in the art, without departing from the concept of the present application, several modifications and improvements can be made, which all belong to the protection scope of the present application. Therefore, the protection scope of the present application patent shall be subject to the appended claims.

What is claimed is:

1. An organic light-emitting diode (OLED) encapsulation structure, comprising a substrate, a self-healing encapsulation layer, and at least two inorganic encapsulation layers,
   wherein a number of layers of the self-healing encapsulation layer is one less than a number of layers of the inorganic encapsulation layers, the self-healing encapsulation layer is made of a material comprising methyl methacrylate and n-butyl acrylate that are mixed in a preset molar ratio, and the preset molar ratio ranges from 45/55 to 55/45; and
   wherein an OLED device is fabricated on the substrate, a cavity is formed between two adjacent layers of the inorganic encapsulation layers, a layer of the self-healing encapsulation layer is provided in the cavity, and one of the inorganic encapsulation layers covers the OLED device.

2. The OLED encapsulation structure according to claim 1, wherein the inorganic encapsulation layer is made of a material comprising silicon nitride.

3. The OLED encapsulation structure according to claim 1, wherein the material of the self-healing encapsulation layer further comprises a curing agent.

4. A method of encapsulating an organic light-emitting diode (OLED), comprising the following steps:
(1) providing a substrate on which an OLED device is fabricated;
(2) forming an inorganic encapsulation layer on the substrate to cover the OLED device;
(3) forming a self-healing encapsulation layer on the inorganic encapsulating layer in the step (2), wherein the self-healing encapsulation layer is made of a material comprising methyl methacrylate and n-butyl acrylate that are mixed in a preset molar ratio;
(4) forming an inorganic encapsulation layer on the self-healing encapsulation layer in the step (3), wherein a cavity is formed between the inorganic encapsulation layer in the step (2) and the inorganic encapsulation layer in the step (4), and the self-healing encapsulation layer in the step (4) is wrapped in the cavity; and
(5) performing the steps (3) and (4) cyclically until formations of all the inorganic encapsulation layers and the self-healing encapsulation layer have been completed.

5. The method of encapsulating the OLED according to claim 4, wherein the step of forming a self-healing encapsulation layer on the inorganic encapsulation layer in the step (2) comprises the steps as follows:
spray-coating the material of the self-healing encapsulation layer on the inorganic encapsulation layer in the step (2); and
after the material of the self-healing encapsulation layer is leveled, performing ultraviolet curing to obtain the self-healing encapsulation layer.

6. The method of encapsulating the OLED according to claim 4, wherein the material of the self-healing encapsulation layer further comprises a curing agent.

7. The method of encapsulating the OLED according to claim 6, wherein the material of the self-healing encapsulation layer is prepared based on the following steps:
mixing the methyl methacrylate, the n-butyl acrylate, and the curing agent to obtain a mixture; and
degassing the mixture under vacuum to obtain the material of the self-healing encapsulation layer.

8. The method of encapsulating the OLED according to claim 4, wherein the preset molar ratio ranges from 45/55 to 55/45.

9. An organic light-emitting diode (OLED) display device, comprising an OLED display panel which comprises an OLED encapsulation structure, wherein
the OLED encapsulation structure comprises a substrate, a self-healing encapsulation layer, and at least two inorganic encapsulation layers,
wherein a number of layers of the self-healing encapsulation layer is one less than a number of layers of the inorganic encapsulation layers, the self-healing encapsulation layer is made of a material comprising methyl methacrylate and n-butyl acrylate that are mixed in a preset molar ratio, and the preset molar ratio ranges from 45/55 to 55/45; and
wherein an OLED device is fabricated on the substrate, a cavity is formed between two adjacent layers of the inorganic encapsulation layers, a layer of the self-healing encapsulation layer is provided in the cavity, and one of the inorganic encapsulation layers covers the OLED device.

10. The OLED display device according to claim 9, wherein the inorganic encapsulation layer is made of a material comprising silicon nitride.

11. The OLED display device according to claim 9, wherein the material of the self-healing encapsulation layer further comprises a curing agent.

* * * * *